United States Patent [19]

Wada et al.

[11] Patent Number: 5,087,584
[45] Date of Patent: Feb. 11, 1992

[54] PROCESS FOR FABRICATING A CONTACTLESS FLOATING GATE MEMORY ARRAY UTILIZING WORDLINE TRENCH VIAS

[75] Inventors: Glen N. Wada, Fremont; Murray L. Trudel, San Jose, both of Calif.

[73] Assignee: Intel Corporation, Santa Clara, Calif.

[21] Appl. No.: 516,161

[22] Filed: Apr. 30, 1990

[51] Int. Cl.[5] .................. H01L 21/265; H01L 21/76
[52] U.S. Cl. ........................................ 437/43; 437/67; 437/200; 148/DIG. 50
[58] Field of Search ............... 437/43, 49, 195, 52, 437/44, 67, 69; 357/23.5; 148/DIG. 50

[56] References Cited

U.S. PATENT DOCUMENTS

| | | | |
|---|---|---|---|
| 4,698,787 | 10/1987 | Mukherjee | 357/23.5 |
| 4,698,900 | 10/1987 | Esquivel | 437/52 |
| 4,763,177 | 8/1988 | Paterson | 357/23.5 |
| 4,814,286 | 3/1989 | Tam | 437/44 |
| 4,849,363 | 7/1989 | Jeuch | 437/43 |

FOREIGN PATENT DOCUMENTS

| | | |
|---|---|---|
| 0280276 | 2/1988 | European Pat. Off. . |
| 0258141 | 3/1988 | European Pat. Off. . |
| 2032687B | 3/1983 | United Kingdom . |

Primary Examiner—Brian E. Hearn
Assistant Examiner—C. Chaudhari
Attorney, Agent, or Firm—Blakely, Sokoloff, Taylor & Zafman

[57] ABSTRACT

A process for fabricating ultra-high density (e.g., 64Mbit) contactless EPROMs and/or flash EPROMs in a silicon substrate is described. Spaced-apart island members are formed of poly 2/ dielectric/poly 1 layers over gate oxide regions. Each island member is associated with one of the cells within the array, and is separated from each other by trenches extending down to either the field oxide or substrate regions. Elongated, parallel, spaced-apart source/drain regions are formed on adjacent sides of the channel regions by ion implantation. The trenches are then filled with an insulating material and a plurality of wordlines patterned across the array. Each wordline makes electrical contact to the control gate members associated with the single row of cells within the array.

30 Claims, 8 Drawing Sheets

FIG_3

FIG_4

FIG_5

FIG_7

FIG_10

PROCESS FOR FABRICATING A CONTACTLESS FLOATING GATE MEMORY ARRAY UTILIZING WORDLINE TRENCH VIAS

FIELD OF THE INVENTION

The present invention generally relates to the field of semiconductor processing; most particularly to methods of fabricating semiconductor memory devices employing floating gates.

BACKGROUND OF THE INVENTION

Non-volatile semiconductor memory cells employing floating gates which are completely surrounded by an insulative layer such as silicon dioxide are well-known in the prior art. These cells are referred to as EPROMs, EEPROMs, flash EPROMs and flash EEPROMs. According to their basic operating principle, charge is transferred to a floating gate member (typically polysilicon) through a variety of mechanisms such as avalanche injection, channel injection, tunnelling, etc. In general, an EPROM or an EEPROM comprises a silicon substrate including source and drain regions which define a channel therebetween. The polysilicon floating gate is disposed above the channel and separated from the substrate by a relatively thin gate insulative layer. Likewise, the control gate is disposed above and insulated from the floating gate. An example of this category of device is shown in U.S. Pat. No. 3,500,142 and also in U.S. Pat. No. 4,203,158.

All non-volatile semiconductor memory cells store electrons (i.e., charge) on the floating gate in a capacitive manner. In the case of a flash EPROM or EEPROM cell, the entire memory array may be electrically erased at one time. That is, individual cells are not separately erasable as in current EEPROMs. This block erasable feature is described in co-pending application Ser. No. 07/253,775, filed Oct. 5, 1988 entitled "Low Voltage EEPROM Cell", assigned to the assignee of the present invention. U.S. Pat. No. 4,698,787 of Mukherjee et al., similarly discloses an electrically erasable programmable memory device which is programmed by hot-electron injection from the channel onto the floating gate, and erased by Fowler-Nordheim Tunnelling from the floating gate to the substrate.

The push toward higher density EPROM memory arrays has lead to the development of the contactless, electrically programmable and electrically erasable memory cell array. In the contactless array, cells employ elongated source/drain regions which are often referred to as "bit lines". These cells often require virtual ground circuitry for sensing and programming. An example of this type of array and a process for fabricating the same is disclosed in U.S. Pat. No. 4,780,424, which is assigned to the assignee of the present invention. A contactless cross-point cell whose floating gate is self-aligned to wordlines and bit lines within an array is also described in an article entitled, "A New Self-Aligned Field Oxide Cell For Multi-Mega Bit EPROMs", written by O. Bellezza et al., IEDM 1989, page 579-582.

According to the basic architecture of these arrays, the floating gates are formed over a thin gate oxide grown between the source and drain regions in the substrate. The source and drain regions form the bit lines of the array. Wordlines are generally defined perpendicular to the source and drain bit lines, with the array contacts being spaced-apart to serve multiple wordlines, e.g., 16, 32, 64, etc. An EPROM cell structure suitable for use in a virtual ground array architecture and which employs asymmetrically doped source and drain junctions is described in "An Asymmetrical Lightly-Doped Source (ALDS) Cell For Virtual Ground High Density EPROMs" by K. Yoshikawa et al., IEDM 1988, pages 432-435.

While the benefits of the contactless array architecture are obvious, there remains a need to improve features which affect the performance and manufacturability of these type of arrays. For example, the layout and/or process architecture of conventional contactless EPROM arrays is generally incompatible for tungsten wordline integration. Furthermore, many prior conventional EPROM processes incorporate non-self aligned source diffusions which constrict the minimum source diffusion width (e.g., due to bird's beak encroachment).

As will be seen, the present invention overcomes these drawbacks by providing a process for fabricating ultra-high density (e.g., 64 Mbit) contactless non-volatile semiconductor memory arrays useful in multimegabit EPROMs and flash EPROM applications. The architecture produced by the invented process is compatible for integration of tungsten metal wordlines. This scheme utilizes wordline trench-vias (patterned through the array planarization) filled either partially or completely by tungsten, or some alternative conductor.

SUMMARY OF THE INVENTION

The present invention covers a process for fabricating ultra-high density floating gate memory cells of the contactless variety in a silicon substrate. According to the present invention, field oxide regions are first formed in the substrate to define the channel regions of the individual cells. Between the field oxide regions, gate oxide regions are formed, a first polysilicon layer is then deposited to completely cover the substrate. On top of this first polysilicon layer, a dielectric layer is then deposited followed by a second polysilicon layer. Thus, a poly 2/dielectric/poly 1 structure is formed over the underlying oxide regions. This structure is first etched to form elongated stacks extending in a first direction. The poly 2/dielectric/poly 1 stacks are then etched again in a second direction to define a plurality of island members, each of which is formed over a gate oxide region. The island members include the dielectric layer sandwiched between a first and second polysilicon members. Each island member is associated with one of the cells within the array, and each is separated from each other by trenches extending down to either to the field oxide or substrate regions. Accordingly, the first polysilicon layer makes up the floating gates for the cells while the second polysilicon layer is utilized as the control gates for the cells.

Once the island members have been completely defined, dopants are introduced into the substrate to form elongated, parallel, spaced-apart source/drain regions on adjacent sides of the channel regions of the cells. The trenches are then filled with an insulating material and a plurality of wordlines patterned across the array. Each wordline makes electrical contact to the control gate members associated with the single row of cells within the array.

One of the principle advantages of the present invention is the flexibility it provides; particularly with respect to formation of the wordlines in the array. According to the present invention, a variety of high conductivity materials such as aluminum, polysilicon, tungsten, tungsten silicide, etc., may be utilized to fabricate low resistance wordlines for the contactless architecture. The resultant contactless array has considerably fewer contacts than required by conventional cell architectures, thereby raising the potential for a significantly higher array density. Additionally, the present invention utilizes self-aligned source/drain bitline diffusions in a non-buried configuration to further increase the achievable cell density. By not having a buried configuration, the cell architecture allows for salicidation (e.g., titanium converted to titanium silicide) of the source-/drain regions which also adds to the overall cell density.

BRIEF DESCRIPTION OF THE DRAWINGS

The novel features believed characteristic of the invention are set for in the appended claims. The invention itself, however, as well as other features and advantages thereof, will be best understood by reference to the detailed description which follows, read in conjunction with the accompanying drawings, wherein

FIG. 2 illustrates the substrate of FIG. 1 after photoresist masking members have been formed and the underlying nitride layer etched. Additionally, FIG. 2 illustrates a field ion implant of boron.

FIG. 10 illustrates the substrate of FIG. 9 after formation of the wordlines.

DESCRIPTION OF THE PREFERRED EMBODIMENT(S)

A process for fabricating contactless non-volatile semiconductor memory cells is disclosed. In the following description, numerous specific details are set forth such as specific doping levels, dimensions, etc., in order to provide a thorough understanding of the present invention. It will be obvious, however, to one skilled in the art, that these specific details need not be employed to practice the present invention. In other instances, well-known processing steps are not described in detail in order to avoid unnecessarily obscuring the present invention. For example, since the present invention is directed to a process for forming a memory array, a detailed discussion of the processing steps affecting the periphery cells (i.e., decoders, etc.) has not been included.

Figure 1:
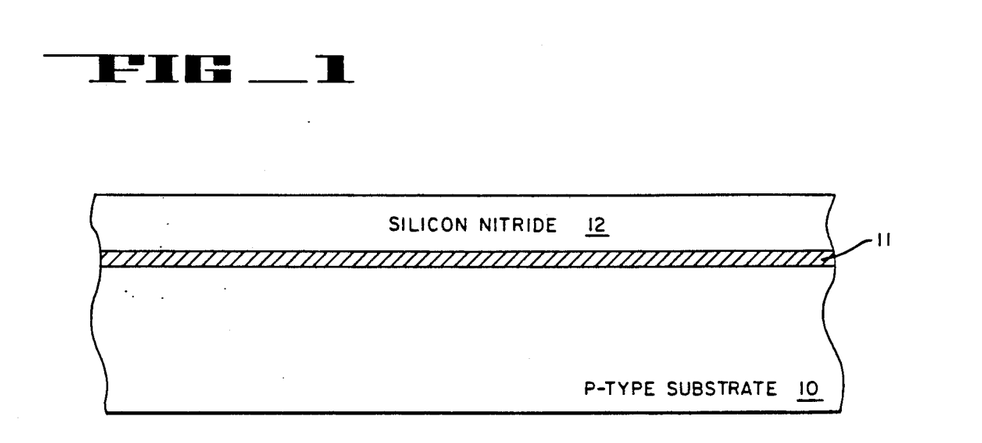
FIG. 1 is a cross-sectional view of a semiconductor substrate over which an oxide layer has been formed. A silicon nitride layer is shown deposited over the oxide layer.

Referring to FIG. 1, initially the entire substrate is subjected to a thermal oxidation cycle to grow an oxide 11 over p-type epitaxial silicon substrate 10. The thickness of oxide layer 11 is preferably 650 Å which is sufficient to protect the underlying substrate during subsequent processing steps. After growth of oxide layer 11, a silicon nitride layer 12 is formed over the substrate. The thickness of nitride layer 12 is generally on the order of 1400 Å, but may vary depending on the particular processing sequence actually employed. The purpose of nitride layer 12 is to provide a masking layer for subsequent field oxide growth.

Figure 2:
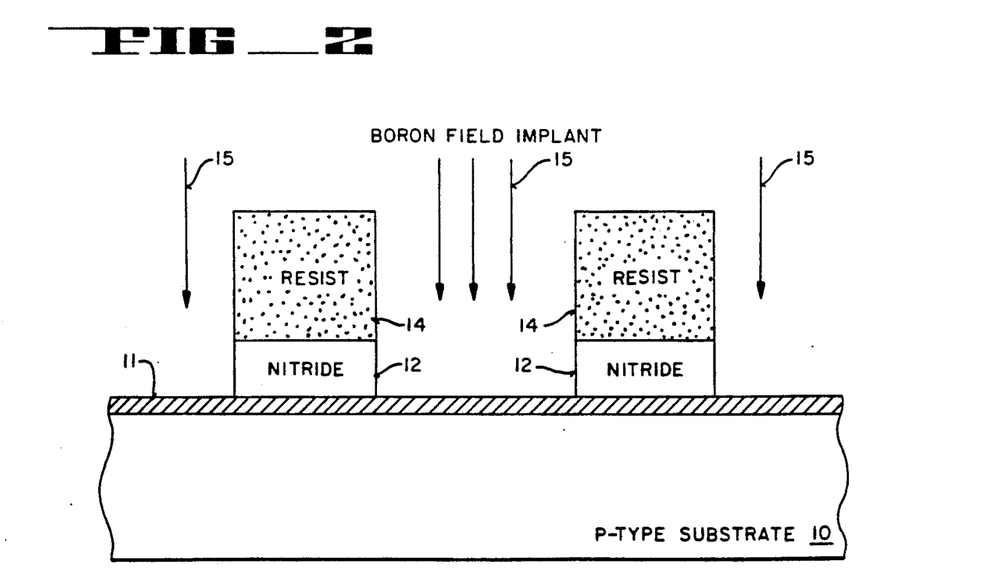

Referring now to FIG. 2, a single photoresist masking layer 14 is used to define the field oxidation regions within the array. The active channel area for the devices within the array will be located largely beneath the nitride layer 12. At this point in the process a field implant is performed before the growth of the field oxide. This field implant ordinarily consists of a high energy boron implant. In the currently preferred embodiment, boron is implanted at an energy of 70 KeV with a dose of $\sim 5 \times 10^{12}$ atoms/cm$^2$. This boron implant is depicted in FIG. 2 by arrows 15. Note that boron implant 15 penetrates through oxide layer 11 into the substrate 10.

Figure 3:
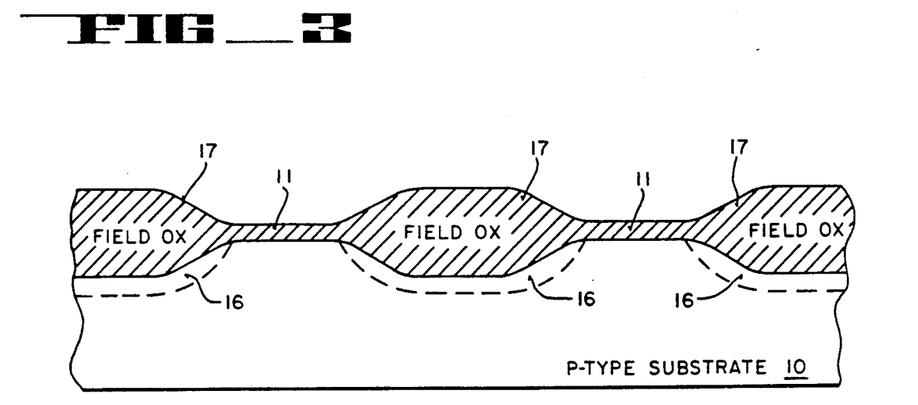
FIG. 3 shows the substrate of FIG. 2 following growth of field oxide regions and subsequent removal of the silicon nitride layer.

Following the boron field implant, masking members 14 are removed and field oxidation growth proceeds. In the currently preferred embodiment, field oxidation takes place in a furnace at 920° C. in a wet O$_2$ atmosphere. Oxide growth continues until approximately 3200 Å of field oxide has been grown. Once the target thickness has been obtained, nitride members 12 are removed. The result is shown in FIG. 3 which illustrates field oxide regions 17 separated by the much thinner oxide layer 11. The boron implant is shown by the dashed regions 16 formed directly below field oxide regions 17. (For reasons of clarity, field implant regions 16 are not explicitly shown in the subsequent Figures.)

It should be understood that at this point in the processing the field oxidation steps have produced elongated, parallel, spaced-apart field oxide regions 17. These regions extend completely across the array in one direction; that is, masking members 14 themselves comprise elongated, parallel, strips extending across the width of the array. The importance of this aspect of the present invention will become evident in later discussion.

With reference now to FIG. 3, after field oxide growth, the array portion of substrate 10 is completely covered by a silicon dioxide layer consisting of either regions 17 or regions 11. Next, the substrate is subjected to a blanket oxide etch which reduces the thickness of field oxide region 17 and eliminates oxide regions 11. Following the growth of a sacrificial oxide over the exposed portions of substrate 10 and its subsequent etching, thin gate oxide growth may proceed. The sacrifical oxide growth/etch cycle helps to completely remove any unwanted silicon nitride that may have been formed on the substrate during field oxidation and which might interfere with subsequent processing steps if not removed.

Gate oxide 19 is a high-grade thermal oxide which in the currently preferred embodiment assumes a thickness of approximately 115 Å. Note that this thickness is typical for flash applications but may vary for other types of device structures or applications. Like field oxide regions 17, thin gate oxide regions 19 are elongated, parallel, spaced-apart from one another and extend completely across the array in the currently preferred embodiment.

Figure 4:
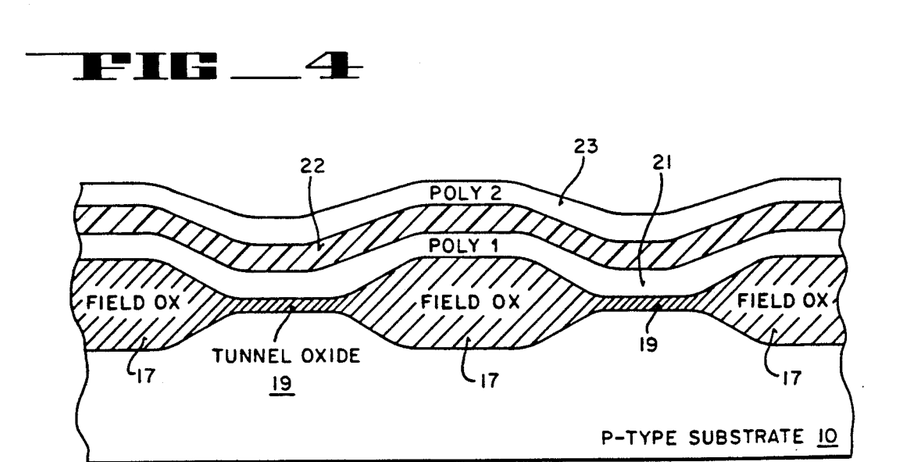
FIG. 4 illustrates the substrate of FIG. 3 following formation of the thin gate oxide regions, the deposition of a first polysilicon layer followed by an interpoly dielectric, and then a second polysilicon layer.

After thin gate oxide 19 is formed, a layer of polysilicon 21 is deposited over the substrate. The thickness of polysilicon layer 21 is optimally on the order of 1500 Å. Directly over poly layer 21 a interpoly dielectric 22 is formed. Interpoly dielectric layer 22 may comprise silicon dioxide or, preferably a silicon dioxide/silicon nitride/silicon dioxide (ONO) stack. Other materials or insulators may also be used which provide similar results. Note that layers 21 and 22 are shown extending continuously over the surface of the substrate in FIG. 4. The effective oxide thickness of interpoly dielectric 22 is approximately 280 Å in the embodiment of FIG. 4.

After the formation of layer 22, a second polysilicon layer 23 is conformably deposited over the substrate to a preferred thickness of approximately 1500 Å. Alternatively, thicker polysilicon layers (e.g., 2500-5000 Å) may be formed. In the preferred embodiment, a tungsten silicide layer is formed on top of the second polysilicon; the tungsten silicide layer itself being approximately 2000 Å thick.

According to the present invention, it is generally desired to keep the sum thickness of the second polysilicon and the tungsten layers approximately 3500 Å or greater. This thickness provides adequate margin during a subsequent etching step to expose the control gates without also exposing the underlying floating gate members. In other words, a thick control gate member allows for variation in the oxide etch rates and film thicknesses associated with later processing steps. This aspect of the present invention will be discussed in more detail later. Suffice it to say that the control gate members may comprise either a single second polysilicon layer 23 having a thickness of approximately 3500 Å, or a combination of layers whose sum thickness is nearly the same. Preferably, layer 23 comprises a second polysilicon layer (e.g., 1500 Å) combined with a tungsten silicide layer (e.g., 2000 Å) to yield a total control gate thickness which is on the order of 3500 Å thick.

Figure 5:
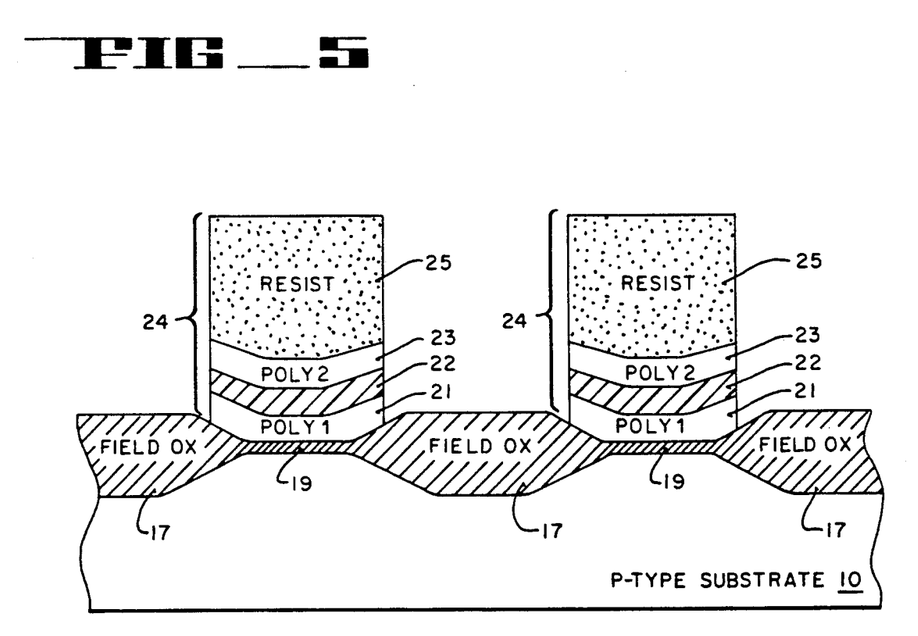
FIG. 5 illustrates the substrate of FIG. 4 after photoresist masking members have been formed and the underlying second polysilicon layer, interpoly dielectric, and first polysilicon layers have been etched.

Referring now to FIG. 5, photoresist masking members 25 are used to define the control gate and floating gate members for the cells within the array. The portions of layer 23, interpoly dielectric 22 and first polysilicon layer 21 which are not covered by photoresist members 25 are anisotropically etched away. This etch stops on the field oxide regions. The polysilicon and dielectric regions underlying masking members 25 are protected during the etching step, with the result being that elongated, parallel, spaced-apart poly 1/ONO/poly 2 stacks 24 are formed over gate oxide regions 19.

Figure 6:
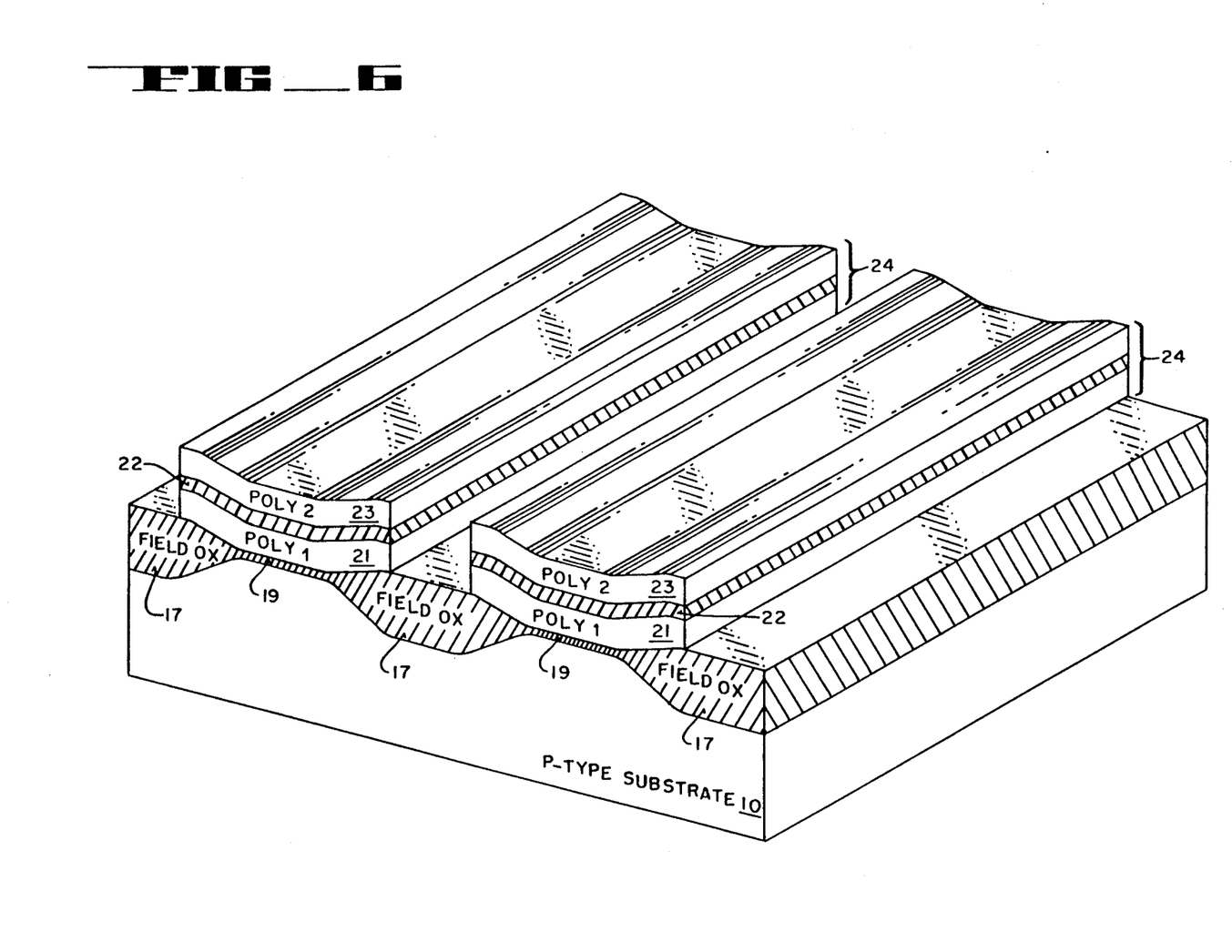
FIG. 6 provides a perspective view of the substrate of FIG. 5, illustrating the elongated stacks formed following the earlier etching step.

FIG. 6 shows a perspective view of the substrate of FIG. 5 in which the extent of stacks 24 is more clearly seen. This view shows stacks 24 extending across the array in the same direction as that of field oxide regions 17 and thin gate oxide regions 19. Stacks 24 are disposed directly above thin gate oxide 19 while overlapping field oxide regions 17 on adjacent sides. Following the last etching step, the top of field oxide regions 17 are left exposed.

Figure 7:
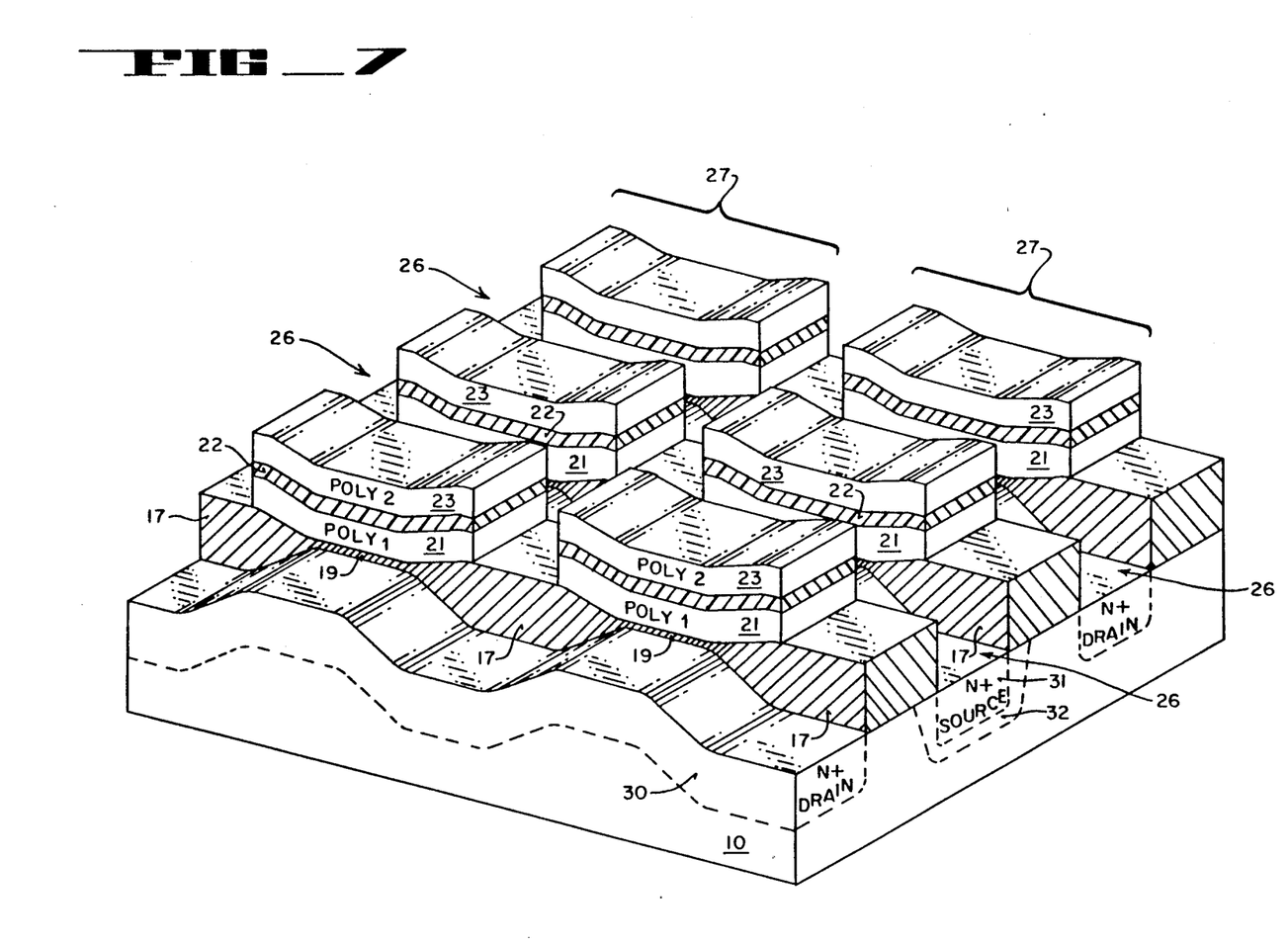
FIG. 7 is also a perspective view of the substrate of FIG. 6 following a second etching step to form spaced-apart island members.

Immediately following the formation of parallel stacks 24, a new photoresist masking layer is used to etch stacks 24 in a second direction generally perpendicular to the first etching step (i.e., perpendicular to stacks 24). The masking members themselves comprise elongated strips of photoresist extending across the array in the second direction. Once again, an anisotropic plasma etch is used to remove second polysilicon layer 23, interpoly dielectric 22 and first polysilicon layer 21 which are not protected by the overlying photoresist masking layer. Using the same masking layer, an additional etch is performed for the purpose of removing the portions of the field oxide not protected by photoresist. The result is shown in FIG. 7 in which the array consists of a plurality of spaced-apart island members 27. Each of the island members is associated with an individual cell within the array. The cells and island members therefore are arranged along rows and columns within the array. Note that the additional etching step performed for the purpose of removing the portions of field oxide regions 17 between island members 27 exposes elongated, parallel regions of substrate 10. As is clearly seen, these exposed regions extend in the second direction. It is also worth mentioning that the etchant which is used to remove the exposed portions of field oxide 17 also removes the portions of thin gate oxide 19 in those same openings. The openings or trenches 26 illustrated in FIG. 7 are used during subsequent ion implantation steps to form the bit lines in the array.

Next, with the same photoresist masking layer from the previous etching steps still in place, the exposed portions of substrate 10 are subjected to an arsenic ion implantation to form n+ drain regions 30 and n+ source regions 31. These source and drain regions 31 and 30, respectively, are elongated, parallel, spaced-apart from one another and run generally perpendicular to the direction in which stacks 24 and oxide region 17 were originally formed. In the currently preferred embodiment, arsenic is implanted at an energy of 35 KeV and a dose of $4 \times 10^{15}$ atoms/cm$^2$.

Following the source/drain implant into trenches 26, the n+ drain regions 30 are covered with a photoresist masking member to protect them from exposure during the subsequent ion implant step. The source regions are then subjected to an additional phosphorous implant which is directed through trenches 26. Preferably, phosphorous is implanted at an energy of 35 KeV and a dose of $6 \times 10^{14}$ atoms/cm$^2$. This forms a deeper source region 32. As a result of this additional phosphorous implant, the source junction is deeper and more graded when compared to the shallower drain junction. The relatively deeper and more graded junction results due to the rapid diffusion properties of phosphorous in silicon. As a consequence, each source region partially extends under its respective floating gate members (i.e., members 21) beyond the edge of diffusion region 31. This facilitates the tunnelling of electrons from the floating gate to the source during erase operations. (It should be understood that the additional phosphorous implant is an optional step, generally only required when fabricating flash-type or EEPROM devices. It may be eliminated for ordinary EPROMs).

Figure 8:
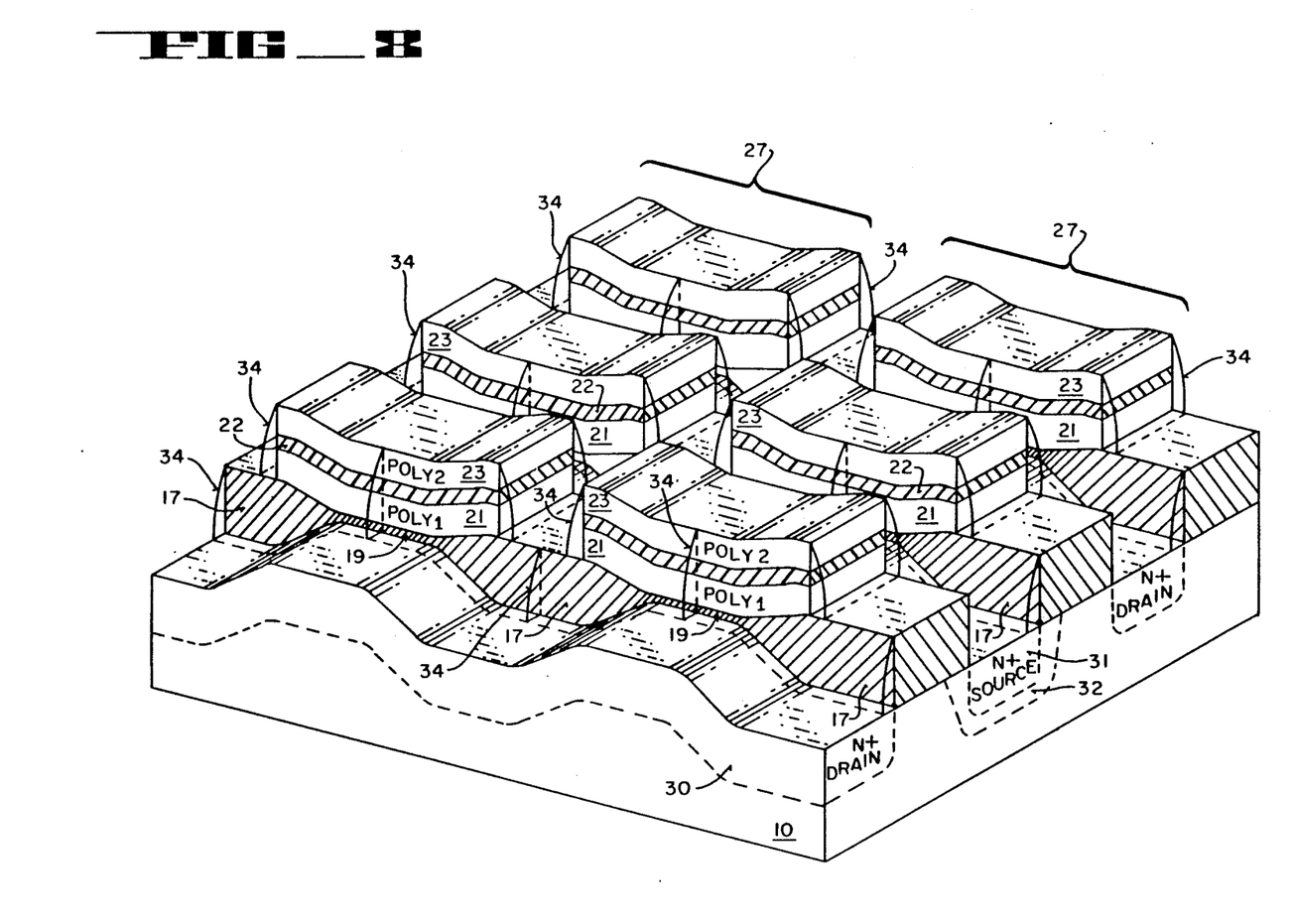
FIG. 8 is a perspective view of the substrate of FIG. 7 following the formation of spacer oxide regions along the sidewall portions of the island members.

Once the source and drain bit line regions have been implanted and a subsequent source/drain reoxidation performed, a low temperature CVD oxide layer is deposited over the substrate to a thickness of approximately 3500 Å. After an anisotropical etchback step, the remaining low temperature oxide forms spacer insulative regions along the side wall portions of island members 27. These side wall spacer oxide regions are shown in FIG. 8 as spacers 34. It should be mentioned that the spacers 34 are formed automatically as a consequence of the fabrication of the peripheral devices in the currently preferred embodiment. The peripheral devices conventionally provide the means for accessing and programming of the individual cells within the array. Spacers 34 may be utilized in the array to prevent silicide from forming along the side wall portions of island members 27, as may be the case in an alternative process flow. Additionally, because the spacer oxide has a slower etch rate than BPSG, spacers 34 provide an added margin of protection against exposure of the interpoly dielectric during a later etch step (to be explained in detail shortly). It is appreciated that in alternative embodiments or fabrication sequences, spacers 34 may be eliminated from the process flow without adversely affecting the array.

After the formation of spacers 34 and a second reoxidation cycle, the entire substrate is blanketed with a deposition of boro-phospho-silicate glass (BPSG). The thickness of the BPSG layer is sufficient to fill trenches 26 and completely cover island members 27. Next, a thermal densification step is employed in order to render the surface of the substrate relatively planar.

Currently, planarization is achieved by depositing a BPSG layer having a thickness in the range of 5000-15000 Å. In the event that this thickness of BPSG is insufficient to completely planarize the surface of the substrate, an optional spin-on glass (SOG) deposition may be used to more completely flatten the topography. In the currently preferred embodiment, a "sacrificial" SOG in conjunction with a 5300 Å BPSG layer is utilized to fulfill the array planarization/trench etchback criteria. The SOG is dipped off (in ~50:1 HF) after trench via formation, but before the wordline conductor deposition, in order to maintain acceptable contact heights.

Figure 9:
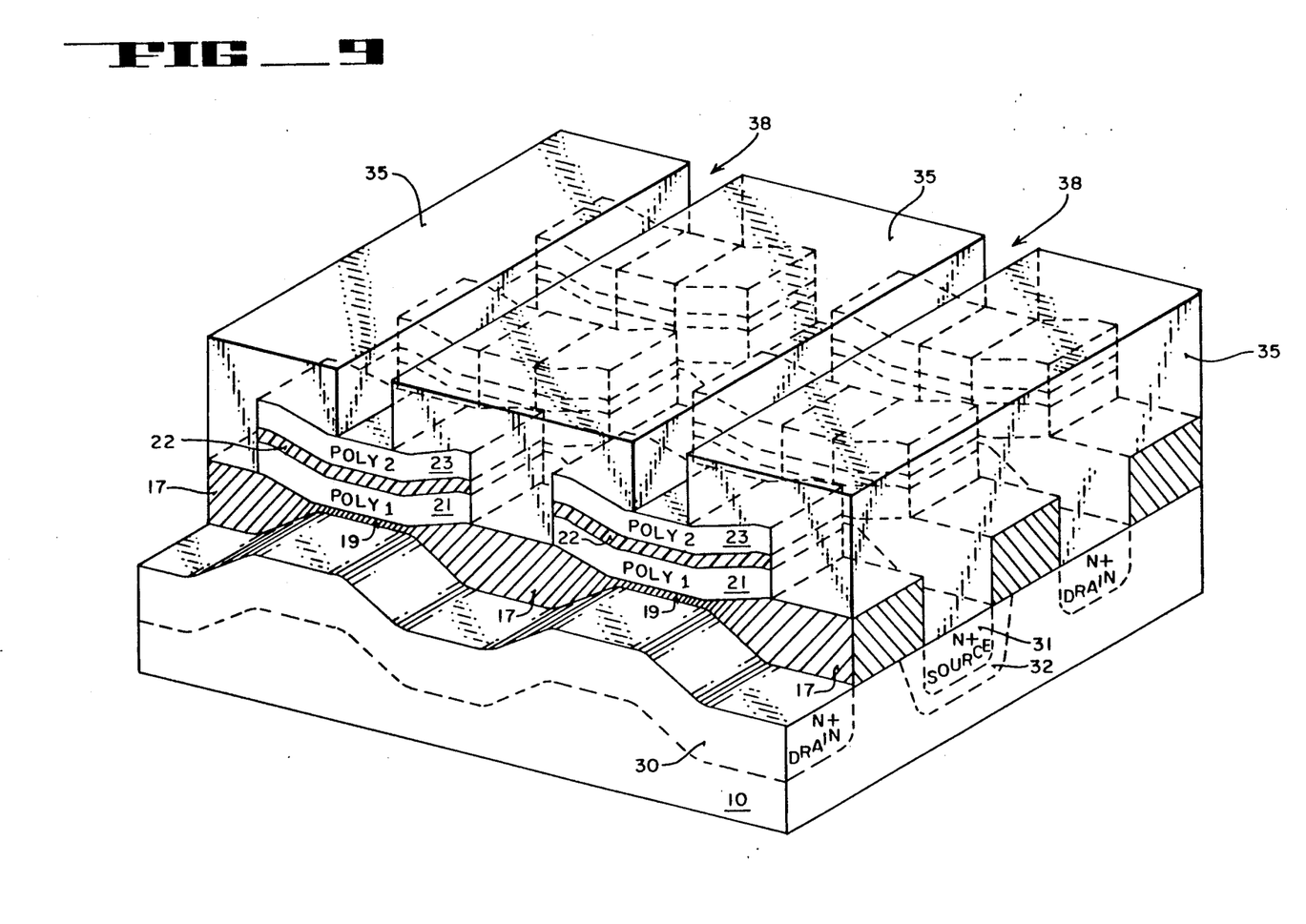
FIG. 9 illustrates the substrate of FIG. 8 following planarization of the surface and subsequent etching to form elongated openings.
Figure 11:
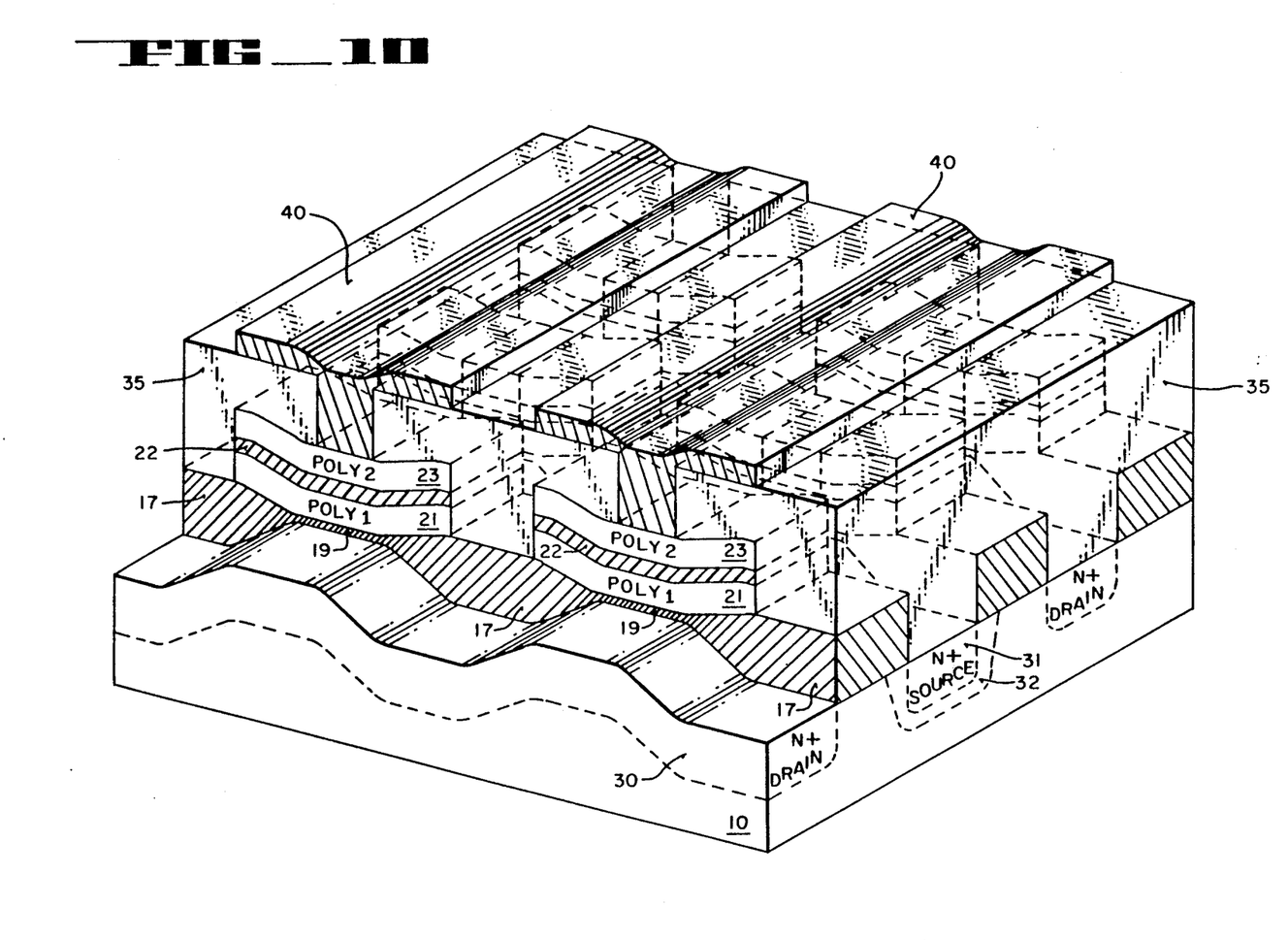

With reference to FIG. 9, layer 35 is shown covering the cells of the array and completely planarizing the surface of the substrate. Following the deposition of insulative layer 35, substrate is masked and a plurality of elongated, parallel, spaced-apart trenches 38 are cut into insulative layer 35. Trenches 38 are formed so as to expose control gate members 23 associated with the row of cells within the array. These openings 38 will be used to form the wordlines within the array. Since control gate members 23 are substantially wider than the width of trenches 38, the wordline control gate formation scheme of the present invention is largely alignment insensitive. Moreover, trenches 38 may only partially overlap control gate members 23 without adverse effects.

Note that trenches 38 extend in the same direction as did original stacks 24 (i.e., generally perpendicular to n+ drain bit line 30 and n+ source bit line 31). A timed plasma etch is currently used to expose the upper surface of polysilicon members 23. Care must be taken to avoid over etching of layer 35 which might result in exposing dielectric layer 22 or floating gate members 21. This is one reason why the control gate members 23 are preferably on the order of 3500 Å or thicker. A thick control gate member allows a comfortable margin of error during the etching process. Preferably, a dry etch cycle using end point detection (i.e., detecting when the tops of poly 2 members 23 are cleared) is utilized during the formation of trenches 38.

Once openings 38 have been defined in insulator layer 35, formation of the wordlines may proceed. Any conductor, such as doped polysilicon, tungsten, tungsten silicide, aluminum, aluminum alloys, etc., may be deposited over the substrate to fill or partially fill trenches 38, thereby making electrical contact to each of the control gate members 23 within the array. Photolithographic masking techniques are used to define wordlines 40 as shown in FIG. 10. Note that wordlines 40 extend across the array in a parallel fashion to each other and generally perpendicular to the underlying bit lines. Currently, wordlines 40 comprise a thin polysilicon layer followed by a thicker tungsten silicide layer to form low resistance conductors.

An alternative method of wordline formation simply involves depositing tungsten (or some other conductor) with a suitable adhesion layer over the substrate to fill trenches 38. A blanket tungsten etchback is then performed to leave tungsten only in the trench-vias 38.

Practitioners in the art will appreciate the flexibility that the present invention provides. Forming control gate wordlines in the manner described utilizing trench vias defined in a post-array BPSG planarization layer facilitates the use of high conductivity metals to form the wordlines. By way of example, wordlines 40 could also function as a first metalization layer for the peripheral devices within the integrated circuit. Moreover, wordline 40 may comprise a variety of metals other than tungsten silicide as mentioned above, due to the fact that subsequent high temperature processing (e. g., reoxidation) is obviated. Prior art processes are usually limited in their choice of a wordline conductor since they must generally undergo further high temperature oxidation cycles following wordline formation. At high temperatures, metals such as aluminum and tungsten suffer deleterious effects. Thus, the wordline formation scheme of the present invention alleviates the exposure of the wordline metal to a high temperature oxidizing ambient (i.e., gate reoxidation).

An added advantage of the present invention is that wordline capacitance to the source/drain bit lines is minimized by the dielectric bridge formed by layer 35 during the planarization process. Thus, the wordlines are always separated from the substrate by a distance approximately equal to the thickness of layer 23, layer 22, layer 21 and gate oxide 19.

In an alternative embodiment, the array BPSG planarization is performed following the self-aligned n+ source/drain implantation and reoxidation. The BPSG is then etched back, i.e., to the poly 2 surface, after which a third layer of polysilicon (i.e., "poly 3") is deposited and doped. This is immediately followed by a tungsten silicide deposition/formation. The entire wordline/control gate/interpoly dielectric/floating gate stack is then masked and etched thereby realizing a self-aligned island structure which includes the wordline. A second cell reoxidation is then required to seal the gate edges prior to "filling in" the openings in the array with BPSG (or some similar planarization material, e.g., TEOS). Note that the need for a second reoxidation step at this point in the process eliminates the use of metals such as aluminum or tungsten as wordline materials for this embodiment.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For instance, although the preferred embodiment is described implementing a flash EPROM array, ordinary EPROMS may also be fabricated without detracting from the spirit or scope of the present invention. Therefore, reference to the details of the preferred embodiments are not intended to limit the scope of the claims.

Thus, a process for fabricating a contactless array of floating gate memory cells in a silicon substrate has been described.

We claim:

1. A process for fabricating an array of floating gate memory cells in a p-type silicon substrate comprising the steps of:
    forming field oxide regions in said substrate which define the channel regions of said cells;
    forming gate oxide regions over said substrate between said field oxide regions;
    depositing a first polysilicon layer over said substrate;
    forming a dielectric layer over said polysilicon layer;
    depositing a second polysilicon layer over said dielectric layer;
    etching said second polysilicon, said dielectric and said first polysilicon layers to form a plurality of island members over said gate oxide regions, each of said island members comprising said dielectric layer sandwiched between said first and said second polysilicon layers, and each of said island members being associated with one of said cells in said array, said island members being separated from each other by trenches wherein said first polysilicon layer comprises the floating gate members and said second polysilicon layer comprises the control gate members of said cells;
    introducing n-type dopants into said substrate to form spaced-apart source/drain regions adjacent to said channel regions of said cells;
    filling said trenches with an insulating material by:
        depositing an insulative layer over said substrate to fill said trenches and cover said island members;
        masking said insulative layer;
        etching said insulative layer to form a plurality of elongated, parallel, spaced-apart openings in said insulative layer over said control gate members; and
    forming a plurality of wordlines across said array, said wordlines making electrical contact to said control gate members associated with a row of said cells.

2. The process according to claim 1 wherein the material for said wordlines is selected from the group consisting essentially of aluminum, polysilicon and tungsten.

3. The process according to claim 2 wherein said dielectric layer comprises an oxide/nitride/oxide composite.

4. The process according to claim 3 wherein said gate oxide is approximately 115 Å thick.

5. The process according to claim 4 wherein said dopants comprise arsenic.

6. The process according to claim 5 wherein said wordlines comprise tungsten.

7. The process according to claim 1 further comprising the step of forming a spacer oxide along the side wall portions of said island members following the formation of said island members.

8. The process according to claim 1 wherein said etching step comprises the steps of:
    etching said second polysilicon, said dielectric and said first polysilicon layers to form a plurality of elongated, parallel, spaced-apart stacks extending across said array in a first direction;
    forming masking members patterned over said stacks in a second direction generally perpendicular to said first direction;
    etching the exposed portions of said stacks thereby forming said island members and said trenches; and
    etching the exposed portions of said field oxide regions.

9. The process according to claim 8 wherein said introducing step is performed prior to the removal of said masking members.

10. A process for fabricating an array of floating gate memory cells in a p-type silicon substrate comprising the steps of:
    forming elongated field oxide regions in said substrate extending across said array in a first direction, said field oxide regions defining the channel regions of said cells;
    forming elongated gate oxide regions over said substrate between said field oxide regions, said gate oxide regions also extending across said array in said first direction;
    depositing a first polysilicon layer over said substrate;
    forming a dielectric layer over said first polysilicon layer;
    depositing a second polysilicon layer over said second dielectric layer;
    masking said second polysilicon layer;
    etching said second polysilicon layer, said dielectric and said first polysilicon layer to form a plurality of spaced-apart, elongated stacks extending across said substrate in said first direction, each of said stacks overlying said gate oxide regions and comprising said dielectric layer sandwiched between said first and second polysilicon layers;
    masking said stacks;
    etching said stacks in a second direction generally perpendicular to said first direction to form a plurality of island members separated by trenches, each of said island members being associated with one of sai cells in said array wherein said first polysilicon layer comprises the floating gate members and said second polysilicon layer comprises the control gate members of said cells;
    implanting n-type dopants into said substrate to form elongated, parallel, spaced-apart source/drain regions adjacent to said channel regions of said cells;
    filling said trenches with an insulating material by;
        depositing an insulative layer over said substrate to fill said trenches and cover said island members rendering said substrate substantially planar;
        masking said insulative layer;
        etching said insulative layer in said first direction to form a plurality of elongated, parallel, spaced-apart openings in said insulative layer over said control gate members;
        stopping said etching of said insulative layer after the top surface of said control gate members has been exposed; and
    forming a plurality of wordlines across said array, each of said wordlines making electrical contact to said control gate members associated with a row of said cells.

11. The process according to claim 10 wherein said source/drain regions extend across said array in said second direction.

12. The process according to claim 11 wherein said dielectric layer comprises an oxide/nitride/oxide composite.

13. The process according to claim 12 wherein the material for said wordlines is selected from the group consisting essentially of aluminum, polysilicon and tungsten.

14. The process according to claim 13 wherein said implanting step comprising the steps of:
 implanting a first ion species into said source and drain regions; and
 implanting a second ion species into said source region such that said source region is deeper and more graded when compared to said drain region.

15. The process according to claim 14 wherein said first ion species comprises arsenic and said second ion species comprises phosphorous.

16. The process according to claim 15 wherein said gate oxide is approximately 115 Å thick.

17. The process according to claim 16 wherein said wordlines extend across said array in said first direction.

18. The process according to claim 17 wherein said wordlines comprises tungsten.

19. The process according to claim 10 further comprising the step of forming a spacer oxide along the side wall portions of said island members following the formation of said island members.

20. The process according to claim 19 further comprising, prior to said implanting step, the step of etching the exposed portions of said field oxide regions down to said substrate.

21. The process according to claim 20 further comprising, immediately after said implanting step, the step of reoxidizing said substrate.

22. A process for fabricating an array of floating gate memory cells on a silicon substrate of a first conductivity type comprising the steps of:
 forming an oxide on said substrate;
 forming elongated field oxide regions in said substrate in a first direction thereby defining the channel regions of said cells;
 removing said oxide;
 thermally growing elongated gate oxide regions over said substrate between said field oxide regions, said gate oxide regions extending across said array in said first direction;
 depositing a first polysilicon layer over said substrate;
 forming an interpoly dielectric layer comprising an oxide/nitride/oxide composite over said first polysilicon layer;
 depositing a second polysilicon layer over said interpoly dielectric layer;
 depositing tungsten silicide layer over said second polysilicon layer;
 masking said tungsten silicide layer;
 etching said tungsten silicide layer, said second polysilicon layer, said dielectric in said first polysilicon layer to form a plurality of elongated, parallel, spaced-apart stacks extending across said substrate in said first direction, each of said stacks being formed over said gate oxide regions and comprising, from top to bottom, said tungsten silicide, said second polysilicon, said interpoly dielectric, and said first polysilicon layers;
 masking said stacks;
 etching said stacks in a second direction generally perpendicular to said first direction to form a plurality of island members separated by trenches, each of said island members being associated with one of said cells in said array wherein said first polysilicon layer comprises the floating gate members and said tungsten silicide and said second polysilicon layers comprise the control gate members of said cells;
 etching said field oxide regions in said second direction;
 implanting ions into said substrate to form elongated, parallel, spaced-apart, source/drain regions of a second conductivity type extending across said array in said second direction adjacent to said channel regions of said cells;
 depositing an insulative layer over said substrate to fill said trenches and cover said island members in a substantially planar fashion;
 masking said insulative layer;
 anisotropically etching said insulative layer along said first direction to form a plurality of elongated, parallel, spaced-apart openings in said insulative layer over said control gate members;
 stopping said etching of said insulative layer after the top surface of said control gate members has been exposed and before the sides of said interpoly dielectric have been exposed;
 forming a plurality of wordlines across said array in said first direction, each of said wordlines making electrical contact to said control gate members associated with a row of said cells.

23. The process according to claim 22 wherein said first conductivity type is p-type and said second conductivity type is n-type.

24. The process according to claim 23 further comprising the step of performing a boron field implant prior to the formation of said field oxide regions.

25. The process according to claim 22 wherein the material for said wordlines is selected from the group consisting essentially of aluminum, polysilicon and titanium.

26. The process according to claim 25 further comprising the step of reoxidizing said substrate immediately following said implanting step.

27. The process according to claim 26 wherein said implanting step comprising the steps of:
 implanting a first ion species into said source and drain regions; and
 implanting a second ion species into said source region such that said source region is deeper and more graded when compared to said drain region.

28. The process according to claim 27 wherein said gate oxide is approximately 115 Å thick.

29. The process according to claim 22 wherein said wordlines comprise tungsten or tungsten silicide.

30. The process according to claim 29 further comprising the step of forming a spacer oxide along the side wall portions of said island members following the formation of said island members.

* * * * *

UNITED STATES PATENT AND TRADEMARK OFFICE
CERTIFICATE OF CORRECTION

PATENT NO. : 5,087,584
DATED : February 11, 1992
INVENTOR(S) : Glen N. Wada, et al It is certified that error appears in the above-indentified patent and that said Letters Patent is hereby corrected as shown below:

Col. 10, Line 44   Delete "sai"   Add --said--

Signed and Sealed this

First Day of March, 1994

Attest:

Attesting Officer

BRUCE LEHMAN

Commissioner of Patents and Trademarks